United States Patent [19]
Hasegawa et al.

[11] Patent Number: 5,223,376
[45] Date of Patent: Jun. 29, 1993

[54] METHOD FOR PRODUCING FINE PATTERNS UTILIZING SPECIFIC POLYMERIC DIAZONIUM SALT, OR DIAZONIUM SALT/SULFONE GROUP CONTAINING POLYMER, AS PHOTOBLEACHABLE AGENT

[75] Inventors: Masazumi Hasegawa; Masaaki Todoko; Mitsutoshi Fukuda, all of Yamaguchi, Japan

[73] Assignee: Toyo Soda Manufacturing Co., Ltd., Yamaguchi, Japan

[21] Appl. No.: 815,885

[22] Filed: Jan. 6, 1992

Related U.S. Application Data

[63] Continuation of Ser. No. 445,157, Dec. 6, 1989, abandoned, which is a continuation of Ser. No. 63,877, Jun. 19, 1987, abandoned.

[30] Foreign Application Priority Data

Jun. 20, 1986 [JP] Japan .................. 61-142840
Jun. 20, 1986 [JP] Japan .................. 61-142841

[51] Int. Cl.⁵ .................. G03F 7/30; G03F 7/021; G03C 7/54
[52] U.S. Cl. .................. 430/326
[58] Field of Search .............. 430/311, 325, 326, 141, 430/145, 156, 160, 162, 163, 168, 169, 175, 176

[56] References Cited

U.S. PATENT DOCUMENTS

| | | | |
|---|---|---|---|
| 2,498,722 | 2/1950 | Straley | 430/163 |
| 3,199,981 | 8/1965 | Sus et al. | 430/163 |
| 3,353,984 | 11/1967 | Landau | 430/156 |
| 4,391,894 | 7/1983 | Shimiza et al. | 430/175 |
| 4,518,668 | 5/1985 | Nakayama | 430/49 |
| 4,576,893 | 3/1986 | Nakakita et al. | 430/175 |
| 4,578,342 | 3/1986 | Sekiya | 430/175 |
| 4,721,700 | 1/1988 | Hosoi et al. | 427/152 |

FOREIGN PATENT DOCUMENTS

| | | | |
|---|---|---|---|
| 161660 | 11/1985 | European Pat. Off. | 430/176 |
| 818911 | 8/1959 | United Kingdom . | |

OTHER PUBLICATIONS

Dinaburg, M. S., "Photosensitive Diazo Compounds", The Focal Press, 1965, pp. 87-95.
Halle, L. F., "A Water Soluble Contrast Enhancement Layer", J. Vac. Sci. Tech., vol. B3, No. 1, Jan./Feb., 1985, pp. 323-326.
Patent Abstracts of Japan, vol. 7, No. 82, P-189, 1227, Apr. 1983.

*Primary Examiner*—Charles L. Bowers, Jr.
*Assistant Examiner*—Christopher G. Young
*Attorney, Agent, or Firm*—Sughrue, Mion, Zinn, Macpeak & Seas

[57] ABSTRACT

A method for producing fine patterns is disclosed, comprising spin-coating a photosensitive resin solution as an upper layer, which comprises a diazonium salt as a photobleachable agent, water and/or an organic solvent, and a polymer, on a photoresist layer as a lower layer and then light-exposing both the upper layer and the lower layer, wherein the polymer in the upper layer has a structural unit shown by formula (I):

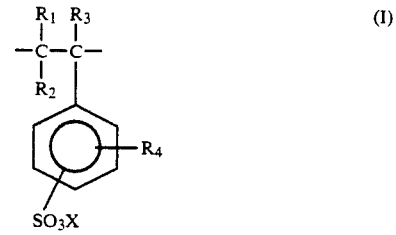

wherein $R_1$, $R_2$, and $R_3$ each represents a hydrogen atom, an alkyl group having from 1 to 4 carbon atoms, a halogen atom, or a nitrile group; $R_4$ represents a hydrogen atom, an alkyl group having from 1 to 4 carbon atoms, a halogen atom, a hydroxyl group, or a carboxyl group; and X represents a hydrogen atom, an alkali metal, an alkaline earth metal, or an ammonium group.

According to another embodiment of this invention, a method for producing fine patterns is disclosed, comprising spin-coating a photosensitive resin solution as an upper layer, which comprises a diazonium salt as a photobleachable agent, water and/or an organic solvent, and a polymer, on a photoresist layer as a lower layer, wherein a counter anion of the diazonium salt is a functional group of the polymer in the photosensitive resin.

According to this invention, a light of low contrast can be increased to one of high contrast without requiring complicated steps, and patterns of less than 1 $\mu$m can be produced with good precision.

8 Claims, No Drawings

METHOD FOR PRODUCING FINE PATTERNS UTILIZING SPECIFIC POLYMERIC DIAZONIUM SALT, OR DIAZONIUM SALT/SULFONE GROUP CONTAINING POLYMER, AS PHOTOBLEACHABLE AGENT

This is a continuation of application Ser. No. 07/445,157 filed Dec. 6, 1989, one abandoned, which is a continuation of application Ser. No. 07/063,877 filed Jun. 19, 1987, now abandoned.

FIELD OF THE INVENTION

This invention relates to a method for producing fine patterns in the field of semiconductors. More particularly, the invention relates to a method for producing fine patterns by spin-coating a photosensitive resin on a resist for improving both the dimensional precision and the resolution of patterns produced by light exposure.

BACKGROUND OF THE INVENTION

With the increase of integration scale of integrated circuits, the feature sizes of patterns tend to shrink more and more and, recently, a high-precise pattern profile of less than about 1 μm in line width has been demanded. For meeting this demand, various methods have been proposed.

For example, from the aspect of apparatus, at the following two points:

(1) use of a light source of shorter wavelengths; and (2) use of lens having a large numerical aperture have been proposed for increasing the resolution from optical theory, and test machines are marketed. However, when a light source having shorter wavelengths is used, the percent transmission of a lens is reduced and, thus, a sufficient amount of the light is not obtained. Also, when a lens having a large numerical aperture is used, there occurs a problem that the resolution becomes worse on the wafer with topography because the depth of focus becomes shallow.

On the other hand, from the aspect of the resist, the development of a resist having high contrast (hereinafter referred to as "high-gamma resist") has been attempted. A high-gamma resist surely improves the resolution to some extent. Also, the high-gamma resist can be produced by controlling the molecular weight and dispersion degree of a polymer in the resist. However, in the case of using such a high-gamma resist, there is a restriction on the material to be used, and the resolution is not improved to a great extent.

Also, from the aspect of lithography, there are proposed the following methods:

(1) a method of using a multilayer resist; and (2) a method of spin-coating a photosensitive resin on a resist film.

The method of using a multilayer resist can provide patterns having a high resolution of less than about 1 μm, but there are yet problems as an industrial technique in the method because the process is complicated, the production of devices requires a too long period of time, and the yield for the production of devices is low.

In the method of spin-coating a photosensitive resin on a resist film, the resolution is improved as follows. That is, light directly after passing through a mask has high contrast, but the contrast of the light is reduced after the light passes through space and a lens. In this regard, according to the improved method, the reduced contrast of the light is increased again by passing through the photosensitive resin to thereby improve the resolution.

As a photobleachable material contained in the photosensitive resin, there are proposed nitron compounds as described, for example, in Japanese Patent Application (OPI) No. 104642/84 or diazonium salts as described, for example, in Japanese Patent Application (OPI) No. 238829/85 (the term "OPI" as used herein means an "unexamined published patent application").

The method of using a nitron compound may certainly improve the resolution, but since in the method an interlayer is required between a resist layer as the lower layer and a photosensitive layer as an upper layer, there are problems that the process becomes complicated and the yield for the production of semiconductors is not so improved.

In the method of using a diazonium salt, the improvement effect for resolution is not yet satisfactory, and the diazonium salt to be used has problems in terms of storage stability.

The inventors have investigated on the method of using a diazonium salt as a photobleachable agent in the aforesaid methods of forming a photosensitive layer which is bleached by light based on the considerations that a method capable of simultaneously developing a photosensitive layer with the developer of the lower layer can simplify the process, and a great improvement of resolution can be expected in this case.

As the result of investigations using a method reported as an evaluation method for the mechanism of positive photoresist. (F. H. Drill et al, *Characterization of Positive Photoresist*, IEEE Transactions on Electron Devices, Vol. ED-22, No. 7, July 1975 by IBM Corp., U.S.A.), the inventors have discovered that the resolution can be greatly improved by increasing an A value as defined below.

The A value is generally shown by the following equation:

$$A = \frac{1}{d} \ln \frac{T(\infty)}{T(0)}$$

T(0): Initial Transmittance
T($\infty$): Final Transmittance
d: Film Thickness

For increasing the A value, it can be considered to reduce the film thickness (d), give a high transmittance to the photosensitive layer (upper layer) after bleaching (that is, the value of T($\infty$) is near 100% as close as possible), and also reduce the initial transmittance T(0) as low as possible. In order to reduce the value of T(0), the concentration of a diazonium salt as a photobleachable agent in the photosensitive layer may be increased, but if the concentration thereof is increased, crystals of the photobleachable agent deposit after coating, which results in rather reducing the resolution.

Also, a method of adding an additive such as a sulfonic acid derivative or a salt thereof for increasing the solubility as disclosed in Japanese Patent Application (OPI) No. 238829/85 cannot increase the effect owing to the limitation on the addition amount thereof because if the amount is large, the coating properties of the photosensitive layer are reduced.

Furthermore, there is also a problem that the diazonium salt as a photobleachable agent is poor in heat stability.

Diazonium salts capable of absorbing a light of longer wavelength are generally poorer in stability. However, as described above, the lithography using light having a short wavelength has a problem that the light transmittance is lowered. Furthermore, manufacturers for semiconductor integrated circuits have a desire of elongating the life of a light-exposure apparatus (mainly using a light of 436 nm at present) in order to avoid an increase in investment for equipment and, hence, an improvement in stability of diazonium salts is an important factor in this field of technique.

Thus, when the stability of a diazonium salt was investigated by adding thereto a stabilizer such as phosphoric acid, organophosphoric acid, citric acid, tartaric acid, etc., an improvement effect was confirmed to some extent and, hence, when a large amount of the aforesaid additive was added for further improving the stability of the salt, it was further confirmed that the coating properties were reduced to thereby lower the resolution.

For solving the above-described problems, the inventors have made various investigations on polymers used for photosensitive resins, and as the result thereof, it has been discovered that by using a polymer containing a benzenesulfonic group, the solubility of the diazonium salt in a solvent is increased, the deposition of crystals of the diazonium salt at spin-coating is prevented, and further the stability of the diazonium salt can be improved.

Also, it has been found that by utilizing a functional group of the polymer in a photosensitive resin as a counter anion of the diazonium salt, a large amount of the diazonium salt can be dissolved without reducing the coating properties and, at the same time, the stability of the diazonium salt can be improved. As the result thereof, fine patterns can be produced with high precision, and based on these discoveries, the present invention has been attained.

SUMMARY OF THE INVENTION

An object of this invention is, therefore, to solve the aforesaid problems and provide a method of producing fine patterns with high precision by a simple process.

That is, according to a first embodiment of this invention, there is provided a method for producing fine patterns by spin-coating a photosensitive resin as an upper layer, which comprises a diazonium salt as a photobleachable agent, at least one of water and an organic solvent, and a polymer, on a resist layer as a lower layer and then light-exposing both the upper layer and the lower layer, wherein the polymer in the upper layer has a structural unit represented by formula (I) shown below:

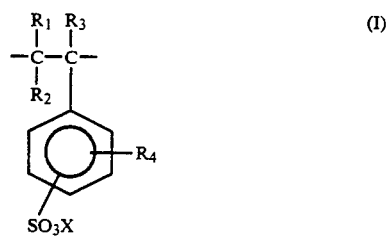

wherein $R_1$, $R_2$, and $R_3$ each represents a hydrogen atom, an alkyl group having from 1 to 4 carbon atoms, a halogen atom, or a nitrile group; $R_4$ represents a hydrogen atom, an alkyl group having from 1 to 4 carbon atoms, a halogen atom, a hydroxyl group, or a carboxyl group; and X represents a hydrogen atom, an alkali metal, an alkaline earth metal, or an ammonium group.

According to a second embodiment of this invention, there is provided a method for producing patterns by spin-coating a photosensitive resin as an upper layer, which comprises a diazonium salt as a photobleachable agent, at least one of water and an organic solvent, and a polymer, on a resist layer as a lower layer and then light-exposing both the upper layer and the lower layer, wherein a counter anion of the diazonium salt is a functional group of the polymer in the photosensitive resin.

DETAILED DESCRIPTION OF THE INVENTION

In the first embodiment of this invention, the polymer in the photosensitive resin has the structural unit shown by formula (I) described above.

The polymer for use in this invention may be a homopolymer of a compound shown by the structural unit of formula (I) described above or a copolymer of the compounds themselves each shown by the aforesaid structural unit, or further may be a copolymer of the compound shown by the aforesaid structural unit and other generally known copolymerizable compound.

Examples of such a comonomer producing the copolymer with the structural unit having a benzenesulfonic group (formula (I)) are styrene, α-methylstyrene, vinylpyridine, acenaphthylene, vinylaniline, vinylnaphthalene, vinylacetophenone, acrylic acid or derivatives thereof, methacrylic acid or esters thereof, acrylonitrile, maleic anhydride, maleic acid imide or derivatives thereof, allyl esters, vinyl esters, acrolein, acrylamide or modified products thereof, propenylanisole, vinyl ethers, indene, isoprene, etc.

There is no particular restriction on the copolymerization ratio of a compound shown by the structural unit having a benzenesulfonic group as in formula (I) to the aforesaid comonomer having no benzenesulfonic group, but it is preferred that the polymer contains at least 50 mol % of the compound shown by the structural unit having a benzenesulfonic group as in formula (I).

Also, any solvents which do not dissolve the resist as the lower layer can be used as the solvent for the photosensitive resin, but water is preferably used. Furthermore, if necessary, a stabilizer for the diazonium salt may be incorporated in the photosensitive resin.

In the second embodiment of this invention, any polymers which are, when dissolved in water, dissociated to become an ion and show a low pKa value may be used as a polymer for the photosensitive resin, but polymers having a sulfonic group are preferably used. For example, there are polyvinylsulfonic acid, chondroitinsulfuric acid, and salts of these acids as such a polymer, but a polymer having the structural unit shown by formula (I) is preferably used.

In the polymer for the photosensitive resin which is used in the second embodiment of this invention, there is no particular restriction on the molar ratio of the functional group which can be a counter anion of the diazonium salt to a free functional group, but it is preferred that the content of the free functional group is at least 30 mol %. Furthermore, if necessary, the photosensitive resin may contain a stabilizer for the diazonium salt, such as phosphoric acid, an organic acid, citric acid, tartaric acid, etc.

For producing the photosensitive resin containing a diazonium salt having a functional group of the polymer as a counter anion a stoichiometrically excessive amount of the aforesaid polymer is mixed with an aqueous solution of the diazonium salt and, thereafter, low-molecular weight salts are removed from the mixture by dialysis, etc., whereby the aimed photosensitive resin containing the diazonium salt having a functional group of the polymer as a counter anion can be obtained.

Then, a method for producing patterns of this invention is explained in detail.

First, a resist, preferably a positive photoresist, which is ordinarily used as a photoresist, is spin-coated on a wafer. Any positive resists which can be dissolved together with the photosensitive resin by a developer for the resist can be used as the positive photoresist in this invention.

After spin-coating the resist, prebaking is conducted and, thereafter, a photosensitive resin composed of the aforesaid reaction product of a diazonium salt and a polymer and water and/or an organic solvent is spin-coated on the resist layer. Conventionally known diazonium salts which absorb well the light from a light source can be used as the diazonium salt in this case.

For example, when the exposure is performed by a light of 436 nm, a 2-(N,N-dimethylamino)-5-methylthiobenzenediazonium salt, a 2,4',5-triethoxy-4-biphenyldiazonium salt, a 2,5-diethoxy-4-(p-tolylthio)-benzenediazonium salt, etc., can be used as the diazonium salt.

Also, when the exposure is performed using a light of 365 nm, a 4-α-naphthylaminobenzenediazonium salt, a 2,5-dimethoxy-4-morpholinobenzenediazonium salt, etc., can be used as the diazonium salt.

After spin-coating the photosensitive resin, the assembly is image-wise exposed to light having a frequency to which both the upper and the lower layer are sensitive and then developed with a developer for the resist used for developing the resist layer and, at the same time, dissolving off the photosensitive resin layer, to thereby produce fine patterns of the resist on the wafer.

The present invention is explained with reference to the following examples, but it is not to be construed that the invention is limited thereto.

EXAMPLE 1

For testing the stability of a diazonium salt, 100 ml of a photosensitive resin having the composition shown below was placed in a thermostat of 30° C., and the change of the A value with a lapse of time was measured. The results obtained are shown in Table 1 below.

| Composition of Photosensitive Resin | |
|---|---|
| Sodium Polystyrenesulfonate (PS-5, made by Toyo Soda Manufacturing Co., Ltd.) | 10 g |
| 4-Morpholino-2,5-dimethoxybenzenediazonium Chloride ½ Zinc Chloride Double Salt | 2.4 g |
| Water | 90 g |

EXAMPLE 2

The same experiment as in Example 1 was performed by using polystyrenesulfonic acid in place of the sodium polystyrenesulfonate. As the polystyrenesulfonic acid in this case, one obtained by gradually adding dropwise a 10% aqueous solution of PS-5 to a concentrated hydrochloric acid to precipitate polystyrenesulfonic acid, followed by drying was used. The results obtained are shown in Table 1 below.

COMPARATIVE EXAMPLE 1

The same experiment as in Example 1 was performed by using polyvinylpyrrolidone having a molecular weight of 24,500 (made by Nakarai Kagaku Yakuhin K.K.) in place of the sodium polystyrenesulfonate. In this case, for comparing the stability of the photosensitive resins used in the Examples, the amount of the diazonium salt was controlled to match the starting A value as close as possible. The results of the change of the A value with a lapse of time are shown in Table 1 below.

COMPARATIVE EXAMPLE 2

To the photosensitive resin having the same composition as in Comparative Example 1 was added tartaric acid as a stabilizer for the diazonium salt in an amount of 3% by weight of the diazonium salt. Using this solution, the same experiment as in Example 1 was performed. The results obtained are shown in Table 1 below.

TABLE 1

| Composition | Example 1 | Example 2 | Comparative Example 1 | Comparative Example 2 |
|---|---|---|---|---|
| Sodium Polystyrenesulfonate | 10 g | — | — | — |
| Polystyrenesulfonic Acid | — | 10 g | — | — |
| Polyvinylpyrrolidone | — | — | 10 g | 10 g |
| Tartaric acid | — | — | — | 0.1 g |
| 4-Morpholino-2,5-dimethoxybenzenediazonium chloride ½ Zinc Chloride Double Salt | 2.4 g | 2.4 g | 3.1 g | 3.2 g |
| Water | 90 g | 90 g | 90 g | 90 g |
| Change of A value with a Lapse of Time | | | | |
| First Day | 4.75 | 4.82 | 4.68 | 4.77 |
| Tenth Day | 4.70 | 4.80 | 4.07 | 4.63 |
| Twentieth Day | 4.42 | 4.61 | 3.30 | 3.98 |
| Thirtieth Day | 4.17 | 4.48 | 2.96 | 3.19 |
| Fortieth Day | 3.84 | 4.00 | 2.21 | 2.31 |

EXAMPLE 3

A positive photoresist, OFPR-800 (made by Tokyo Ohka Kogyo Co., Ltd.) was spin-coated on a silicon wafer at a thickness of 0.9 μm and, thereafter, the coated layer was prebaked for 10 minutes at 80° C. Then, a photosensitive resin having the composition shown below was spin-coated thereon at a thickness of 0.35 μm.

| Composition of Photosensitive Resin | |
|---|---|
| 2,5-Dimethoxy-4-(N,N-dimethylamino)-benzenediazonium Chloride ½ Zinc Chloride Double Salt | 4.8 g |
| Sodium Polystyrenesulfonate | 10 g |
| Water | 90 g |

Then, exposure was performed by a 5/1-reduction projection type light exposure apparatus (stepper) equipped with a lens having a numerical aperture of 0.35 to transfer a mask pattern onto the wafer and, thereafter, development was performed using a developer, NMD-3 (made by Tokyo Ohka Kogyo Co., Ltd.)

for one minute. When the pattern profile of the resist was observed by a scanning electron microscope, it was confirmed that a clear rectangular line of 0.8 μm in width was obtained.

COMPARATIVE EXAMPLE 3

By following the same experiment as in Example 3 except that the spin-coating of the photosensitive resin was omitted. In this case, however, the exposure amount necessary for the transfer was a half of that in Example 3. As the result of observation by a scanning electron microscope, the resolution was confirmed to be 1.2 μm.

EXAMPLE 4

The same experiment as in Example 3 was performed except that polystyrenesulfonic acid was used in place of the sodium polystyrenesulfonate as the polymer in the photosensitive resin. The results showed that the resolution was 0.8 μm.

COMPARATIVE EXAMPLE 4

For performing the same experiment as in Example 3 by using polyvinylpyrrolidone in place of the sodium polystyrenesulfonate as the polymer in the photosensitive resin, the photosensitive resin was spin-coated on the resist layer. In this case, the formation of crystals of the diazonium salt was observed. The assembly was exposed to light as it was and, after the development, the pattern produced was observed by a scanning electron microscope. In this case, a clear pattern was not obtained, and the resolution could not be measured.

EXAMPLE 5

The same experiment as in Example 3 was performed using 2-(N,N-dimethylamino)-5-methylthiobenzenediazonium chloride ½ zinc chloride in place of the diazonium salt. In this case, the resolution was 0.9 μm.

EXAMPLE 6

To an aqueous solution of 4-α-naphthylaminobenzenediazonium chloride prepared according to an ordinary method was added two times equivalent of sodium polystyrenesulfonate having a molecular weight of 50,000 (PS-5, made by Toyo soda Manufacturing Co., Ltd.) and, thereafter, low-molecular weight salts such as sodium chloride, etc. were removed from the mixture using a commercially available cellulose dialysis membrane (Spectra/Porc, made by Spectrum Corp.) to provide an aqueous solution of the photosensitive resin (concentration: 15% by weight) composed of a polystyrenesulfonate having a sulfonic group which can be a counter anion of the diazonium compound and a free sulfonic group in a molar ratio of 1/1.

The aqueous solution of the photosensitive resin thus prepared was spin-coated on a quartz plate to produce a uniform thin film of 0.35 μm in thickness, the transmittances T(0) and T(∞) of the film before and after the light exposure were measured, and the A value at a wavelength of 365 nm was evaluated. The results showed that the A value was 6.3. Also, the aqueous solution of the photosensitive resin prepared in this example was allowed to stand in a thermostat of 35° C in the dark for 20 days and, then, the A value was evaluated as described above. The results showed that the A value was 6.2, which showed good storage stability of the photosensitive resin.

COMPARATIVE EXAMPLE 5

By mixing 3 g of a 4-α-naphthylaminobenzenediazonium chloride ½ zinc chloride double salt as a diazonium salt, 10 g of polyvinylpyrrolidone having a molecular weight of 24,500 (made by Nakarai Kagaku Yakuhin K.K.) as a polymer, and 90 g of water, an aqueous solution of the photosensitive resin was obtained. The results of evaluating the A value by the same manner as in Example 6 showed that the A value was 4.6.

In addition, when a larger amount of the diazonium salt than the aforesaid amount was dissolved in the aqueous solution, crystals deposited in the spin-coated film and, hence, a uniform film could not be produced. The results of determining the A value after allowing to stand the aqueous solution of the photosensitive resin in the dark at 35° C. for 20 days as in Example 6 showed that the A value was 1.6, which showed unsuitability of the photosensitive resin for practical use.

EXAMPLE 7

A positive photoresist, OFPR-800 (made by Tokyo Ohka Kogyo Co., Ltd.) was spin-coated on a silicon wafer at a thickness of 0.9 μm and, thereafter, the assembly was prebaked at 80° C. for 10 minutes. Then, an aqueous solution of the photosensitive resin as prepared in Example 6 was spin-coated on the resist layer at a thickness of 0.35 μm. Thereafter, light exposure was performed using a 5/1-reduction projection type light exposure apparatus (stepper) equipped with a lens having a numerical aperture of 0.42 to transfer a mask pattern and, then, the resist layer was developed by a developer, NMD-3 (made by Tokyo Ohka Kogyo Co., Ltd.) for one minute. When the pattern profile of the resist thus obtained was observed by a scanning electron microscope, it was confirmed that a rectangular line/space pattern of 0.6 μm having vertical walls was obtained.

COMPARATIVE EXAMPLE 6

By following the same procedure as in Example 7 except that the spin-coating of the photosensitive resin was omitted, a resist pattern was obtained. In this case, however, the exposure amount necessary for the transfer was about a half of that in Example 6. As the result of observation by a scanning electron microscope, it was confirmed that a pattern of 0.6 μm could not be resolved.

COMPARATIVE EXAMPLE 7

Transfer of a pattern was performed by a conventional technique. That is, by following the same procedure as in Example 7 except that the photosensitive resin obtained in Comparative Example 5 was used in place of the photosensitive resin in Example 7, the pattern was transferred. As the result of observation by a scanning electron microscope, it was confirmed that although a pattern of 0.6 μm was resolved, the pattern profile produced was too bad to use for practical purpose.

EXAMPLE 8

By following the same procedure as in Example 6 except that 2-(N,N-dimethylamino)-5-methylthiobenzenediazonium chloride was used as the diazonium salt, an aqueous solution of the photosensitive resin (concentration: 13.5% by weight) was obtained. The results of evaluating the A value at a wavelength of 436 nm by the same manner as in Example 6 showed that the A value was 5.4.

Also, a positive photoresist, OFPR-800 was spin-coated on a silicon wafer at a thickness of 1.0 μm and, after prebaking the resist layer at 80° C. for 10 minutes, the aqueous solution of the photosensitive resin was spin-coated thereon at a thickness of 0.30 μm. Then, light exposure was performed by means of a 5/1-reduction stepper equipped with a lens having a numerical aperture of 0.35 to transfer a mask pattern, and the resist layer was developed by a developer, NMD-3 for one minute. As the result of observing the pattern profile thus produced by a scanning electron microscope, it was confirmed that a line/space pattern of 0.8 μm having vertical walls was resolved.

COMPARATIVE EXAMPLE 8

By following the same procedure as in Example 8 except that the spin-coating of the photosensitive resin was omitted, a resist pattern was obtained. In this case, however, the exposure amount necessary for the transfer was about two-third of that in Example 6. As the result of observation by a scanning electron microscope, it was confirmed that the resolution was 1.2 μm.

EXAMPLE 9

By following the same procedure as in Example 6 by using 2,5-diethoxy-4-(p-tolylthio)-benzenediazonium chloride as the diazonium salt and polystyrenesulfonic acid as the polymer, an aqueous solution of the photosensitive resin (concentration: 14% by weight) was obtained. As the result of performing the pattern transfer by the same manner as in Example 8, it was confirmed that a line/space pattern of 0.8 μm was resolved as in Example 8.

As described above, according to this invention, a light of low contrast can be increased to one of high contrast without requiring complicated steps, and a pattern of less than 1 μm can be produced with good precision. Furthermore, since in this invention, the depth of focus is increased, the yield for the production of semiconductor can be improved and, thus, the industrial value of this invention is large.

Moreover, this invention also provides an optical lithographic technique corresponding to the requirement for fining the dimension of circuit patterns in the production of semiconductor, and the industrial value of the process of this invention is also large in this point.

While the invention has been described in detail and with reference to specific embodiments thereof, it will be apparent to one skilled in the art that various changes and modifications can be made therein without departing from the spirit and scope thereof.

What is claimed is:

1. A method for producing fine patterns comprising:
   (a) spin-coating on a prebaked positive photoresist lower layer a photosensitive resin solution as an upper layer, said solution comprising (i) at least one of water and an organic solvent, and (ii) a polymer salt formed by the reaction of a polymer and a diazonium salt,
   wherein said polymer has a structural unit represented by formula (I):

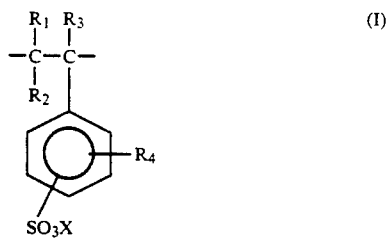

wherein $R_1$, $R_2$ and $R_3$ each represents a hydrogen atom, an alkyl group having from 1 to 4 carbon atoms, a halogen atom, or a nitrile group; $R_4$ represents a hydrogen atom, an alkyl group having from 1 to 4 carbon atoms, a halogen atom, a hydroxyl group, or a carboxyl group; and X represents a hydrogen atom, an alkali metal, an alkaline earth metal, or an ammonium group, and
   wherein the polymer salt formed by the reaction of said polymer and said diazonium salt contains a diazonium cation and an anion which counters the diazonium cation and which anion is an $-SO_3$ group formed from the $-SO_3X$ group of formula (I);
   (b) image-wise exposing said photosensitive resin coated photoresist to thereby bleach the polymer salt formed by the reaction of said polymer and said diazonium salt and thereby increase the light transmittance of the coating layer in the areas exposed to light thereby more selectively enabling exposure of the photoresist layer; and
   (c) developing to produce fine patterns by dissolving off the photosensitive resin layer and dissolving away light exposed areas of the photoresist to produce fine patterns.

2. A method for producing fine patterns as claimed in claim 1, wherein said polymer in the upper layer is a copolymer containing the structural unit shown by formula (I).

3. A method for producing fine patterns as claimed in claim 2, wherein the proportion of the structural unit shown by formula (I) in the copolymer in the upper layer is at least 50 mol %.

4. A method for producing fine patterns as claimed in claim 1, wherein in the polymer salt of the photosensitive resin, the proportion of the free functional group in the polymer salt is at least 30% of both the functional group which can be a counter anion of the diazonium salt and the free functional group.

5. A method for producing fine patterns as claimed in claim 4, wherein the image resolution of the fine pattern is at least 0.8 μm and wherein said photosensitive resin is characterized by an A value at a wavelength of 365 nm of 6.3 or larger as measured by the following equation:

$$A = \frac{1}{d} \ln \frac{T(\infty)}{T(0)}$$

wherein T(0) represents initial transmittance, T(∞) represents final transmittance and d represents film thickness and wherein said positive photoresist layer has a thickness of from 0.9–1.0 μm and the thickness of said photosensitive resin is from 0.3–3.35 μm.

6. A method for producing fine patterns comprising:

(a) spin-coating on a prebaked positive photoresist lower layer a photosensitive resin solution as an upper layer, said solution comprising (i) a diazonium salt as a photobleachable agent, (ii) at least one of water and an organic solvent, and (iii) a polymer, wherein said polymer has a structural unit represented by formula (I) and is present in an amount sufficient to improve solubility of the diazonium salt in the coating solution and also sufficient to improve stability of the diazonium salt:

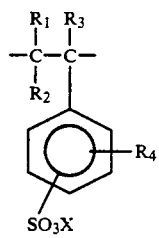

(I)

wherein $R_1$, $R_2$ and $R_3$ each represents a hydrogen atom, an alkyl group having from 1 to 4 carbon atoms, a halogen atom, or a nitrile group; $R_4$ represents a hydrogen atom, an alkyl group having from 1 to 4 carbon atoms, a halogen atom, a hydroxyl group, or a carboxyl group; and X represents a hydrogen atom, an alkali metal, an alkaline earth metal, or an ammonium group;

(b) image-wise exposing said photosensitive resin coated photoresist to thereby bleach the diazonium salt and thereby increase the light transmittance of the coating layer in the areas exposed to light thereby more selectively enabling exposure of the photoresist layer; and (c) developing to produce fine patterns by dissolving off the photosensitive resin layer and dissolving away light exposed areas of the photoresist to produce fine patterns.

7. A method for producing fine patterns as claimed in claim 6, wherein the polymer in the upper layer is a copolymer containing the structural unit shown by formula (I).

8. A method for producing fine patterns as claimed in claim 7, wherein the proportion of the structural unit shown by formula (I) in the copolymer in the upper layer is at least 50 mol %.

* * * * *